United States Patent
Li et al.

(10) Patent No.: US 7,269,772 B1
(45) Date of Patent: Sep. 11, 2007

(54) METHOD AND APPARATUS FOR BUILT-IN SELF-TEST (BIST) OF INTEGRATED CIRCUIT DEVICE

(75) Inventors: Jun Li, San Jose, CA (US); Joseph Tzou, Mountain View, CA (US); Thinh Tran, Palo Alto, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 306 days.

(21) Appl. No.: 10/785,826

(22) Filed: Feb. 23, 2004

(51) Int. Cl.
*G01R 31/28* (2006.01)

(52) U.S. Cl. ................................ 714/733; 714/731
(58) Field of Classification Search .................... None
See application file for complete search history.

(56) References Cited

U.S. PATENT DOCUMENTS 5,822,228 A * 10/1998 Irrinki et al. ............... 714/718
5,912,901 A * 6/1999 Adams et al. .............. 714/733
6,078,637 A    6/2000 Ansel et al.
6,671,842 B1 * 12/2003 Phan et al. ................. 714/733
6,675,336 B1  1/2004 Thakur et al.
6,681,359 B1  1/2004 Au et al.
6,738,938 B2 * 5/2004 Nadeau-Dostie et al. ... 714/719

OTHER PUBLICATIONS

WEBSTER'S II New Riverside University Dictionary, "couple", The Riverside Publishing company, 1984.*

* cited by examiner

*Primary Examiner*—Christine T. Tu
(74) *Attorney, Agent, or Firm*—Haverstock & Owens LLP

(57) ABSTRACT

An integrated circuit device (200) can include a main portion (204) and a built-in self-test (BIST) portion (204) having outputs coupled to physical input structures (e.g., bond pads) (206) of the integrated circuit device (200). A BIST portion (202) can test timing critical parameters that take into account the effect of input structures (206). A BIST portion (202) can apply BIST test signals with a pipeline structure that can emulate timing parameters, such as a set-up time (Ts) and a clock-to-output time (Tco).

15 Claims, 5 Drawing Sheets

METHOD AND APPARATUS FOR BUILT-IN SELF-TEST (BIST) OF INTEGRATED CIRCUIT DEVICE

TECHNICAL FIELD

The present invention relates generally to the testing of integrated circuit devices, and more particularly to built-in self-test (BIST) circuitry configured for timing characterization of integrated circuit devices.

BACKGROUND OF THE INVENTION

In order to reduce overall integrated circuit (i.e., chip) test costs, many modern chips are fabricated with built-in self-test (BIST) circuitry. Such circuitry is considered "built-in" as it is included on the chip itself. This can allow for internally generated test patterns to be applied to a portion of the chip.

The manufacture of integrated circuit devices can be conceptualized as including a "front-end" and a "back-end." A manufacturing front end may include the fabrication of devices on a wafer. A back-end may include slicing wafers into dice, packaging the dice, and testing the resulting packages. With the increasing speed and/or complexity of integrated circuit devices, testing can become an important step in a manufacturing process.

Back-end testing may include a range of possible tests. For example, at one end of the spectrum, such tests can be basic structural tests checking for opens and shorts in the logic circuits of a programmable logic device. At the other end of the spectrum, such tests can check performance features of the chip, such as operational speed, etc. Such tests can allow non-failing devices to be categorized (binned) according their operating characteristics (e.g., speed).

In some arrangements, a tester can be loaded with a test program that exercises various functions of an integrated circuit device. Such an approach can be time consuming as a tester must apply various input signals and wait for the resulting test result signals. In addition, between different devices and/or different tests, test program data may have to be loaded into the tester.

One way to address the complexity, cost and delay in testing integrated circuit devices has been to include self-test circuits on the device itself. Such approaches have been referred to as "built-in self-test" (BIST). BIST capabilities can reduce test times, as the on-board BIST circuits can apply test signals, typically faster than a tester. Further, instead of having a tester sequence through various functions and accumulate results, a tester may only have to read a pass or fail indication. Consequently, simpler, less expensive testers can be used.

To better understand various aspects of the invention, a chip with a conventional BIST circuit will now be described.

FIG. 5 shows a conventional chip arrangement having a BIST capability. A conventional chip 500 can include a BIST block 502 separated from a main chip portion 504. BIST block 502 can test a main chip portion 504. A main chip portion 504 may be a memory array, as but one example. A BIST block 502 can interface directly with a main chip portion 504 and generate an input test pattern for application to the main chip portion 504.

A conventional chip 500 can include bond pads 506-0 to 506-2. Bond pads (506-0 to 506-2) include a clock bond pad 506-0, an address bond pad 506-1, and a control bond pad 506-2. Bond pads (506-0 to 506-1) can also directly interface with the main chip portion 504. However, bond pads (506-0 to 506-1) do not interface with BIST block 502.

As is well understood, bond pads (506-0 to 506-1) can connect to off-chip connections, such as to other chips and/or circuit boards and/or test systems. Thus, a tester, or other chips in an application, can supply signals through such bond pads (506-0 to 506-1) to test, characterize and/or to otherwise access the chip 500.

Most conventional BIST configurations can be used to check various logic states in a main chip portion 504, such as a memory array. However, conventional BIST configurations are not well suited for characterizing timing parameters. Timing parameters can typically reflect signal propagation for an entire timing path of a chip, including input structures such as bond pads, and the like. As a result, conventional BIST configurations provide no emulation of the actual path of signals propagating from the tester through chip bond pads.

Also, many conventional BIST test patterns typically only work for certain critical paths and the overall test coverage relative to a full set of main chip functions and/or states can be low. Because test patterns are usually directly applied to the main chip portion 504, a conventional BIST block 502 is not configured to test such timing parameters as setup time (Ts), hold time (Th), clock-to-output time (Tco), and clock cycle time (Tcyc).

As is well known, a setup time (Ts) can be a time leading up to a clock event during which input data must remain stable in order to guarantee the data values are captured. A hold time (Th) can be the time following a clock event during which input data must remain stable in order to guarantee the data values are captured. A clock-to-output time (Tco) can be the time between a clock event and a particular output signal. A clock cycle time (Tcyc) can be a minimum cycle time at which a chip 500 can operate. Effective characterization of these and other types of timing parameters can be very important for many chips. As but one example, such timing parameters can be important for synchronous static random access memories (SRAMs).

Accordingly, characterization of critical timing parameters has conventionally been accomplished by dropping tester probes onto bond pads and applying sets of test signals (i.e., vectors) to a chip. As noted above, this can be time consuming, complex, and expensive. Such testing of timing critical parameters is typically accomplished by a high speed "class" tester that can be very costly to purchase and or operate.

In light of the above, it would be desirable to arrive at some way of improving the speed and/or ease at which timing parameters are tested for an integrated circuit device.

SUMMARY OF THE INVENTION

The present invention can include an integrated circuit (chip) having a test capability. The integrated circuit can include a main integrated circuit portion that provides functions according to input signals applied at physical inputs to the integrated circuit. In addition, a built-in self-test (BIST) portion can be included that tests the main portion. The BIST portion can include BIST outputs coupled to the physical inputs for emulating predetermined signal timing at the physical inputs.

In such an arrangement, because BIST output signals can be applied to physical inputs (e.g., bond pads) of the integrated circuit, BIST results can take into account the effects that physical input structures can have on time critical parameters, such as setup time (Ts) and clock-to-output (To).

According to one aspect of the embodiments, a BIST portion can include a buffer control circuit that drives at least one physical input according to BIST test input data and provides an electrostatic discharge (ESD) protection path to at least one power supply node with respect to the physical input.

Such an arrangement can result in dual roles for BIST structures; driving BIST data and providing ESD protection. This may provide better BIST capabilities in an advantageously small overall area.

According to another aspect of the embodiments, a buffer control circuit that provides both drive and ESD capabilities can include a transistor of a first conductivity type having a source-drain path coupled between the physical input and a first power supply node and a transistor of a second conductivity type having a source-drain path coupled between the physical input and a second power supply node.

According to another aspect of the embodiments, a BIST portion can include a signal pipeline structure for applying BIST test signals to the physical inputs. The signal pipeline structure can emulate a predetermined input signal timing. More particularly, such an arrangement can enable input signals to be applied in order to emulate timing parameters not measurable in conventional arrangements like that of FIG. 5. For example, such parameters can include a setup time (Ts).

According to another aspect of the embodiments, a pipelined structure within a BIST portion can include a first latch enabled according to a clock signal and a second latch enabled according to setup clock signal. A setup clock signal can have a predetermined phase relationship with respect to the clock signal.

Such an arrangement can essentially gate BIST input data values according to controllable phase difference and hence emulate predetermined timing parameters.

According to another aspect of the embodiments, a phase lock loop (PLL) type circuit can generate clock signals having different phase relationships. Further, each stage of the signal pipeline structure can output data according to a different phase clock signal.

Such an arrangement can allow for a phase relationship between pipeline controlling signals to be established with a reasonable degree of precision.

According to another aspect of the embodiments, a main integrated circuit portion can generate test output data in a test mode. A BIST portion can include a compare circuit that compares expected BIST data from the BIST portion with the test output data to generate a test pass/fail indication.

Such an arrangement can generate pass/fail indications that take into account physical input structures effects, as well as emulated timing parameters without necessarily requiring an expensive class type tester.

According to another aspect of the embodiments, physical inputs can include bond pads. However, the present invention is intended to be applicable to alternate input structures.

The present invention can also include a method of testing an integrated circuit. The method can include class testing the integrated circuit device in a BIST operation by coupling BIST signals to physical inputs of the integrated circuit.

Such an arrangement is in contrast to conventional approaches that would utilize a large class type tester to test high speed parameters of the integrated circuit. Further, such a BIST operation can generate test results that take into account the impact of input structures on critical timing parameters.

According to one aspect of the embodiments, coupling BIST signals to physical inputs of the integrated circuit includes applying BIST input signals generated by a BIST portion of the integrated circuit to bond pads of the integrated circuit.

According to another aspect of the embodiments, a method of testing an integrated circuit can also include programming a BIST portion according to data applied to a serially configured test port, and reporting test results at the serially configured test port.

Such an arrangement can enable such BIST testing to be executed according to the advantages of serial (e.g., low pin count) conventions. Such conventions can include that promulgated by the Joint Test Access Group (JTAG), as but one example.

According to another aspect of the embodiments, coupling BIST signals to physical inputs of the integrated circuit can include applying BIST input signals according to at least two different clock signals to emulate a predetermined timing parameter. Such timing parameters can include a setup time and/or a clock-to-output time.

Such an arrangement can allow the testing of timing critical parameters with a BIST circuit as opposed to a high cost class tester, or the like.

The present invention can also include an integrated circuit device having a main portion that includes a memory cell array coupled to at least one physical clock input and a plurality of physical signal inputs. A physical clock input and physical signal inputs can be formed on the surface of the integrated circuit device. A BIST portion can be formed in a same substrate as a main portion. A BIST portion can have BIST data outputs coupled to physical signal inputs.

Such an arrangement can enable timing parameters for a memory device to be self-tested that take into account the effect of the structure of physical signal inputs. Thus, timing parameters can be checked without having to employ a high cost class tester.

According to one aspect of the embodiments, a BIST portion can include a buffer control circuit coupled to each physical signal input. Each buffer control circuit can include a pipeline structure that applies a BIST data value to the corresponding physical signal input according to predetermined phase relationship with respect to a clock signal, where the clock signal is applied to the physical clock input.

In this way, timing parameters such as setup time (Ts) and clock-to-output time (Tco) can be tested with BIST circuits instead of a high speed tester.

According to another aspect of the embodiments, a phase lock loop type circuit can generate a clock signal and at least one test clock signal having a predetermined phase relationship with respect to a clock signal.

DETAILED DESCRIPTION

Various embodiments of the present invention will now be described in detail with reference to a number of drawings. The embodiments include devices and methods for incorporating built-in self-test (BIST) into an integrated circuit device that can enable the testing of timing parameters. Such testing can take into account input structures such as bond pads, or the like.

Figure 1:
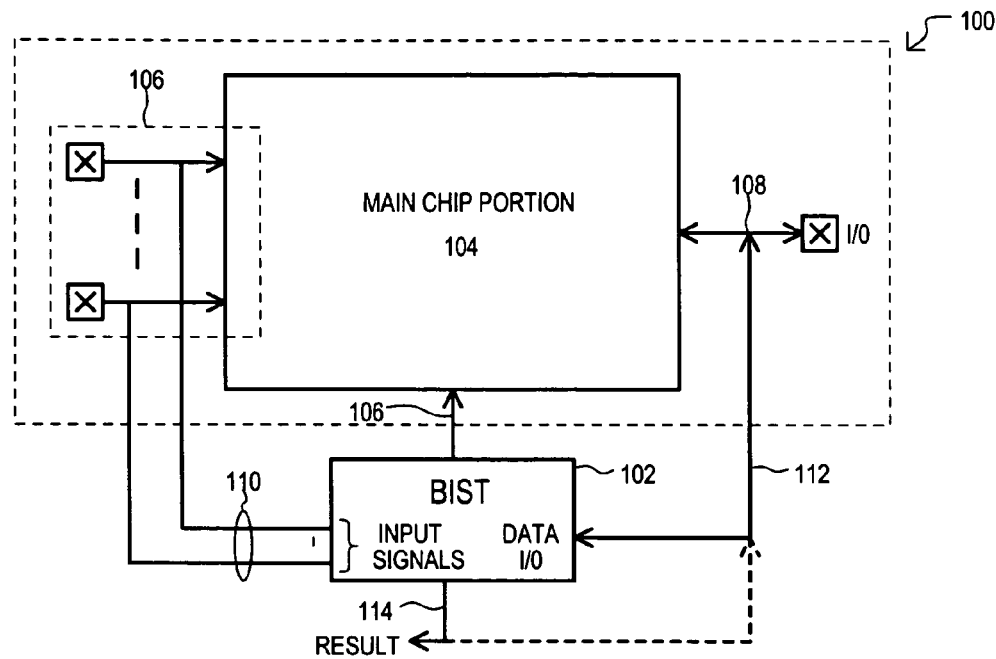
FIG. 1 is a block schematic diagram of a first embodiment of the present invention.

A first embodiment of the present invention is an integrated circuit device (i.e., chip) having a BIST capability. The first embodiment is shown in FIG. 1 in a block schematic diagram and designated by the general reference character 100. A chip 100 can include a BIST block 102, a main chip portion 104, one or more physical input structures 106, and one or more physical input and/or output (I/O) structures 108.

Figure 5:
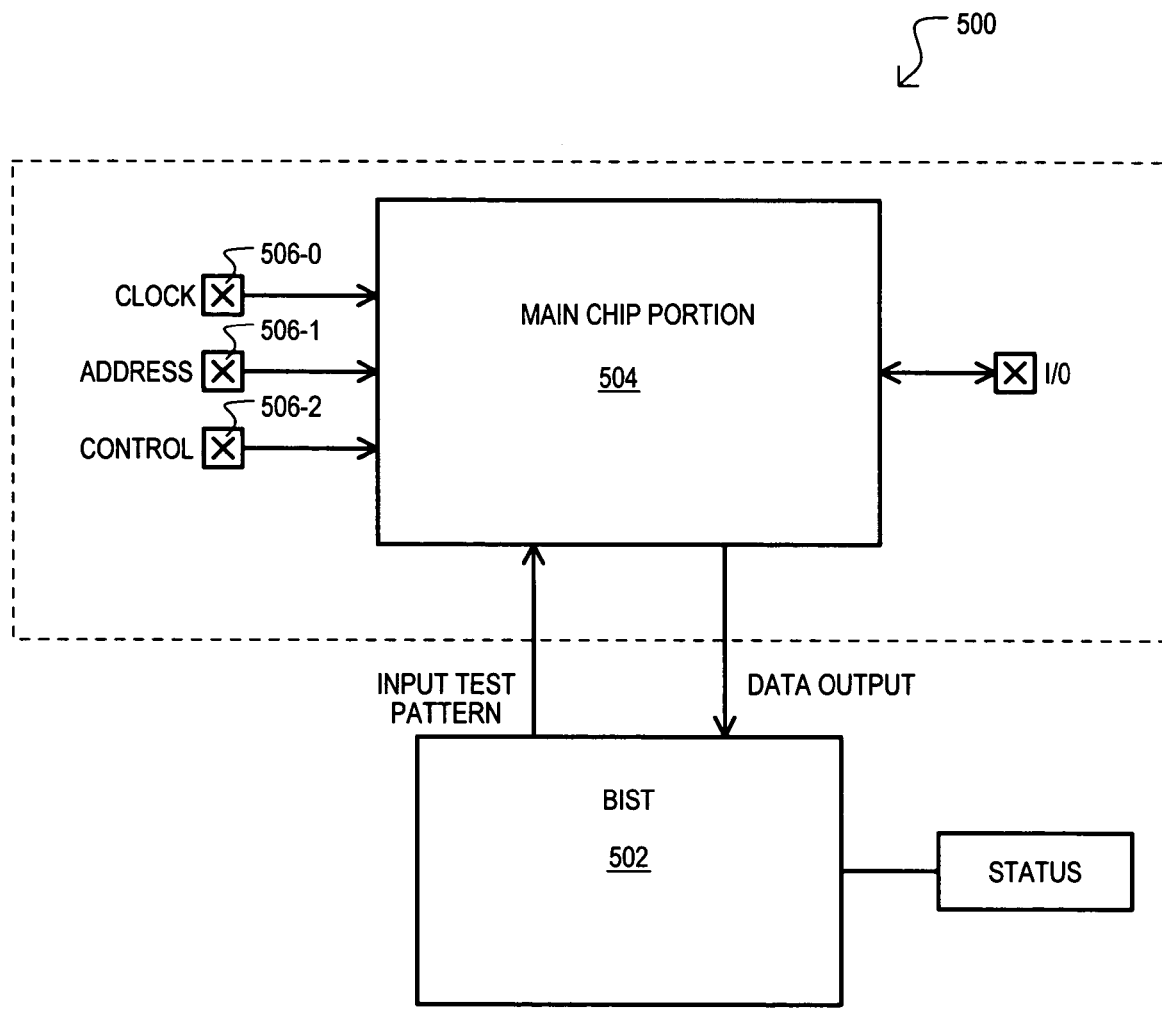
FIG. 5 is a block schematic diagram of a conventional integrated circuit device having a BIST capability.

Unlike a conventional BIST arrangement, like that of FIG. 5, a chip 100 may also include BIST input paths 110 and BIST I/O paths 112. BIST input paths 110 can be connected between physical input structures 106 and BIST block 102. BIST I/O paths 112 can be connected between physical I/O structures 108 and BIST block 102.

A main chip portion 104 can provide a main chip function according to applied inputs. For example, in response to signals applied at physical input structures 106, a main chip portion can generate/receive signals at physical I/O structures 108. A main chip portion 104 may preferably include a memory array, preferably a memory array of a high speed random access memory (RAM), even more preferably a synchronous static RAM (SRAM) memory array.

A BIST block 102 can generate self-test signals and receive self-test results. Further, such results may be provided by a test result output 114. As represented by the dashed line connecting test result output 114 to physical I/O structures 108, BIST results may be provided via a normal output of the chip 100.

Physical input structures 106 can include actual physical inputs for applying signals to a chip 100. As indicated above, in the conventional case of FIG. 5, bond pads are bypassed by conventional BIST block 502 and hence are not represented in such a conventional BIST testing. Physical inputs structures 106 can include bond pads, or the like, for making a physical connection to chip 100. Of course, such a connection should not be limited to bond pads and would include alternate physical connections. Similarly, physical I/O structures 108 can include actual physical inputs for receiving or outputting signals for chip 100.

BIST block 102 can also apply BIST control signals to main chip portion 104 by way of BIST control path 116. BIST control signals may be signals that establish logic-states and/or options for a chip device 100, and may exclude timing critical signals.

Unlike conventional BIST arrangements, a BIST block 102 can apply BIST input signals to physical input structures 106 by way of BIST input paths 110. BIST input signals can be timing critical signals that can affect or establish timing parameters for a chip 100. In addition, or alternatively, a BIST block can apply BIST I/O signals to, or receive output signals from physical I/O structures 108 by way of BIST I/O path 112. Such I/O signals and/or output signals may also affect or otherwise establish timing parameters for a chip 100.

In operation, a chip 100 may be placed into a self-test mode. Such a self-test may be a test selectable from among various self-tests, and/or may be a sequence of tests.

A BIST block 102 can then apply control signals by way of BIST control path 116 to place main chip portion 104 into a desired operational state.

Once the state of main chip portion 104 has been established, a BIST block 102 can drive predetermined BIST input signals on BIST input paths 110. Such input signals will be driven on input structures 106, and thus reflect the effect such structures introduce into actual performance. In particular, such an arrangement can reflect the effect of such structures on timing critical paths and resulting timing parameters.

In the event the current BIST test involves the reading of output data from the chip 100, output data driven on physical I/O structure 108 can be received by BIST block 102 on BIST I/O connections 112. As a result, a BIST test result can represent the actual effect of physical I/O structures 108 on output data from the chip 100.

In the event the current BIST test involves the application of input data to the chip 100, BIST block 102 can drive such data on physical I/O structures 108 by way of BIST I/O connections 112. As a result, a BIST test result can represent the actual effects of physical I/O structures 108 on input data applied to chip 100.

In this way, a chip 100 according to a first embodiment can apply BIST tests and/or generate BIST results, which take into account the effects of actual physical input and/or output structures on timing critical paths.

A second embodiment will now be described with reference to FIG. 2. A second embodiment can include some of the same general constituents as FIG. 1, thus similar sections will be referred to by the same reference character, but with the first digit being a "2" instead of "1".

Figure 2:
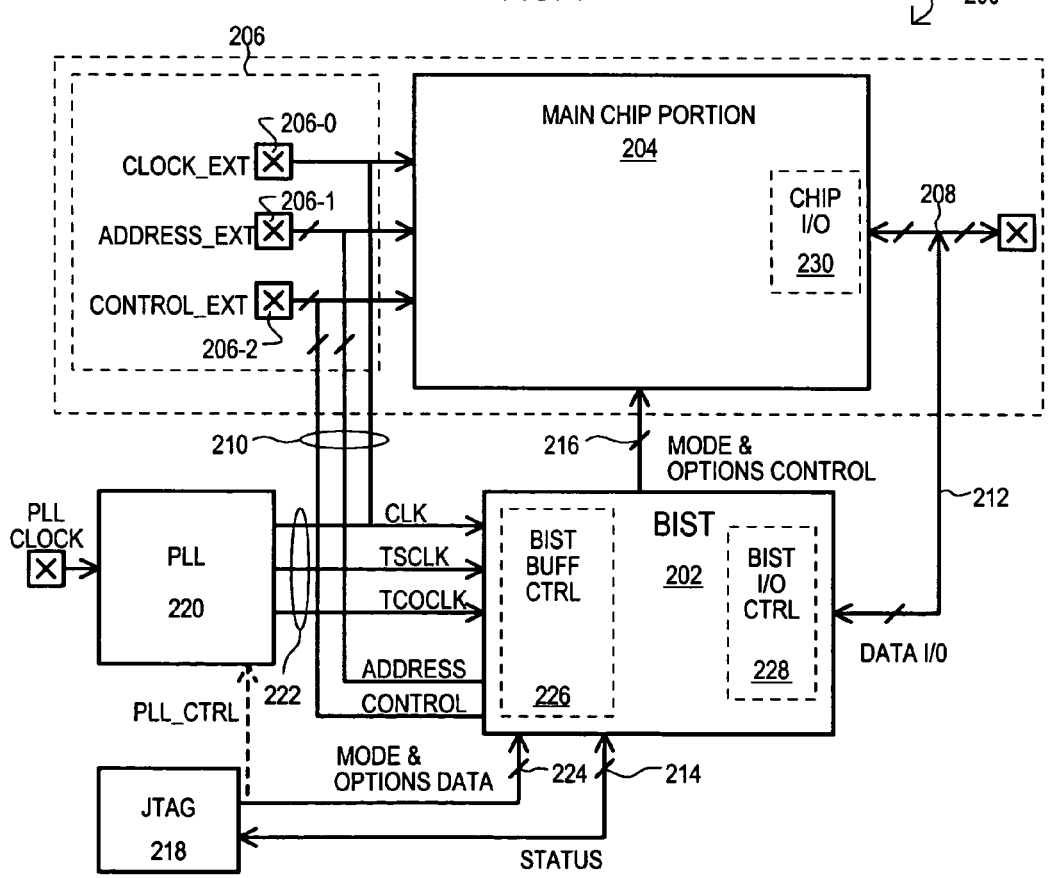
FIG. 2 is a schematic diagram of a second embodiment of the present invention.

FIG. 2 shows a chip 200 that includes a BIST block 202, a main chip portion 204, physical input structures 206, and physical I/O structures 208. A BIST block 202 can be connected to physical input structures 206 by BIST input paths 210 and to physical I/O structures 208 by BIST I/O paths 212. Test results can be provided by a status I/O path 214.

The embodiment of FIG. 2 can represent a memory device chip. Thus, outputs from the BIST block 204 include address signals "ADDRESS" and control signals "CONTROL" that can be routed directly to associated address physical input structures (e.g., bond pads) 206-1 and control physical input structures 206-2 (e.g., bond pads), respectively. Further, data I/Os from BIST block 204 can include data I/O signals (DATA I/O) routed directly to associated physical I/O structures (e.g., bond pads) 208.

In the particular example of FIG. 2, BIST block 204 can also output chip mode control and option signals "MODE & OPTIONS CONTROL" on BIST control path 216. Chip mode and chip option control signals can be logic-state critical signals (as opposed to timing-critical signals), and thus are not be coupled to physical input structures (e.g., bond pad area), but rather directly to a main chip area 204 and/or a portion of chip 200 that includes implementation of the predominant function of the chip.

The particular example of FIG. 2 also includes a test block and interface (I/F) 218. Such a test block and I/F can preferably include a serial test interface, even more preferably a port such as that promulgated by the Joint Test Access Group (JTAG). Of course, a JTAG port could be replaced by any appropriate and/or serially-configured port or path to provide mode and option control information to the BIST block 202 and/or to report a test result.

Data from a test block and I/F 218 can be provided to BIST block 202 by way of test I/F path 224. Such data is shown in FIG. 2 as MODE & OPTIONS DATA.

The example of FIG. 2 also shows a phase-locked loop (PLL) type block 220 coupled to BIST block 202. The PLL type block 220 and corresponding clock tree can provide for precise synchronization between the BIST output signals (e.g., ADDRESS, CONTROL) and signals at or near physical input structures 206. In FIG. 2, clock output signals from PLL type block 220 are provided on clock outputs 222.

Also, a PLL type block 220 and/or the clock tree can allow for a pipelined structure to be used to control emulation of timing operations for chip 200. Such a capability will be described in more detail at a later point herein.

Still further, it is understood that PLL type block 220 can also provide a multiplied frequency version of an input clock (i.e., "CLOCK_EXT") to the chip 200. For example, a PLL may provide an internal clock "CLK" that is about 4x the frequency of an externally received clock signal PLL CLOCK. Such a configuration would allow for testing of the chip at relatively high speed and can be particularly useful for wafer level testing where the clock that is supplied to the chip 200 may have a relatively low frequency with respect to tester and/or operational clock speeds.

In addition, it is understood that a PLL type block 220 is not limited to a strictly PLL circuit (e.g., phase detector, voltage controlled oscillator, etc.) and can include alternate phase shifting signal generating circuits, such as a delay lock loop (DLL) type circuit, as but one example.

In some arrangements, performance of a PLL type block 220 can be established by control data PLL_CTRL. In FIG. 2, such PLL control data can be applied by way of test block and I/F 218. As but a few examples, phase relationships between output signals CLK, TSCLK, TCOCLK can be set, and/or clock multiplication values can be set.

The general operation of a second embodiment will now be described. A chip may be placed into a test mode by a test set signal being applied via test block and I/F 218. This data state may also be forwarded to BIST block 202 by test I/F path 224. In response BIST block 202 can be activated.

Test mode signals can be applied to establish a particular test mode state for test block and I/F 218. Again, such data may be utilized to generate MODE & OPTIONS DATA that is forwarded to BIST block 214. In response to such data, BIST block 202 can generate MODE & OPTION CONTROL signals. Such signals can be applied to main chip portion 204 to set a chip 200 into a particular operational mode.

A PLL clock signal PLL CLOCK can also be applied to PLL type block 220. In response to such a clock, PLL type block 220 can generate clock signals (CLK, TSCLK and TCOCLK) on clock outputs 222. As will be explained at a later point herein, a clock signal CLK, can be an operational clock signal applied to a clock input of chip 200. A clock TSCLK can be a setup clock signal used to test a setup time (Ts) parameter. A clock TCOLK can be a clock-to-output signal used to test a clock to data out (Tco) parameter.

Test data may then be input to test block and I/F 218. Such test data can result in additional data being applied to BIST block 202 by way of test I/F path 224. In response, BIST block 214 can generate appropriate output signals (e.g., ADDRESS, CONTROL, DATA I/O) or enable inputs for input data (e.g., DATA I/O).

In response to the application of test signals, BIST block 202 can generate test results. Such test results can be supplied to test block and I/F 218, which may output test results via its own interface (e.g., serial stream, etc.).

Referring still to FIG. 2, the particular BIST block 202 is shown to include BIST buffer control circuits 226 and BIST I/O control circuits 228. Further, main chip portion 204 is shown to include main chip I/O control circuits 230.

Figure 3A:
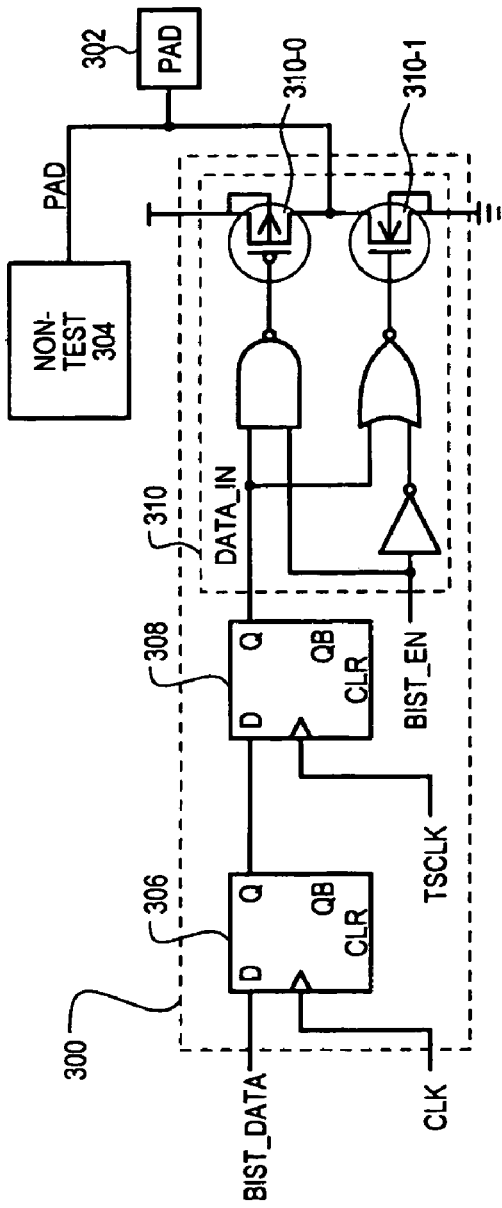
FIG. 3A is schematic diagram of a built-in self-test (BIST) input buffer control circuit that can be included in the second embodiment.

One example of BIST buffer control circuit, such as those shown as 226 in FIG. 2, is set forth in FIG. 3A, and designated by the general reference character 300. A BIST buffer control circuit 300 can be connected to a physical input structure 302 (e.g., a bond pad). It is understood that such an input structure 302 may also be connected to a non-test input circuit 304 which may provide conventional input buffer, latching, etc., for an input signal received at physical input structure 302.

A BIST buffer control circuit 300 can receive test data input "BIST_DATA" generated within BIST block 202. Such data can be applied to input structure 302 according to timing parameters established by clock signals generated by PLL type block 220.

The particular BIST buffer control circuit 300 of FIG. 3A includes first data (D) latch 306, second D-latch 308, and three state driver 310. A first D-latch 306 can receive a BIST data value as a data input, a BIST data clock signal CLK as a clock input, and provide an output (Q) to second D-latch 308. Second D-latch 306 can receive an output of first D-latch 306 as an input, a setup test clock TSCLK as clock input, and provide an output (Q) to three state driver 310.

In this way, BIST test data can be applied based on a pipeline structure, in this case series connected D-latches, which can emulate a predetermined timing parameter.

Three state driver 310 can be enabled by a BIST enable signal "BIST_EN". As is well understood, when enabled (in this case, when BIST_EN is high), three state driver 310 can drive input structure 302 according to an output of second D-latch 308. When disabled (in this case, when BIST_EN is low), three state driver 310 can present a high impedance with respect to input structure 302.

Three state driver 310 can include pull-up device 310-0 and pull-down device 310-1. Pull-up device 310-0 can include a p-channel insulated gate field effect transistor (e.g., MOSFET), and pull-down device 310-1 can include an n-channel MOSFET. These devices can drive input structure 302 with data from a BIST block 202, thus essentially emulating the direct signal driving capability of an external tester on an input structure 302 (e.g., bond pad).

The particular example of FIG. 3A can provide for testing of input setup time parameters for a chip 200. In particular, clock signal CLK and TSCLK can be generated to apply a BIST data value BIST_DATA according to a predetermined setup time. For example, a PLL type block 220 can generate a TSCLK signal having a particular phase relationship to the clock signal "CLK" applied at the clock input of chip 200.

Figure 3B:
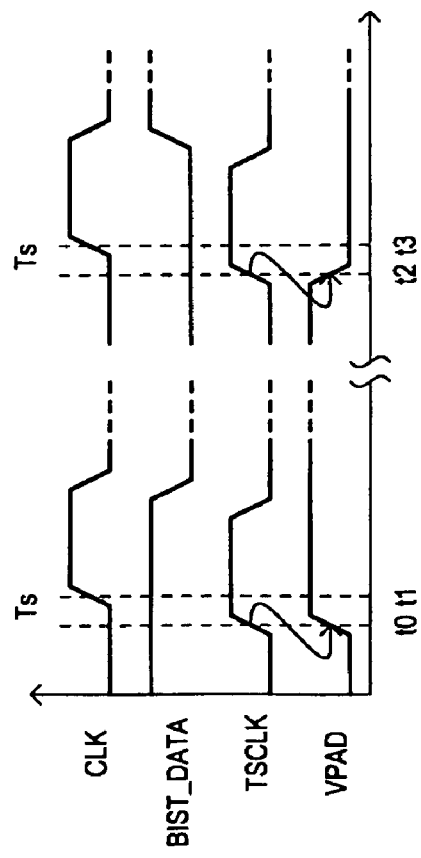
FIG. 3B is a timing diagram that shows a setup time (Ts) emulation according to the circuit of FIG. 3A.

One very particular example of a setup time test arrangement is illustrated in FIG. 3B. FIG. 3B is a timing diagram that includes a clock signal CLK, applied BIST data values BIST_DATA, a setup clock TSCLK, and a resulting driven data value PAD.

As shown by FIG. 3B, a BIST data value can be loaded in a preceding cycle of clock signal CLK. A setup clock TSCLK can then apply such a value (DATA_IN) as an input to three state driver 310 according to a setup time parameter (Ts). If resulting output data is valid, a device may pass a given setup time parameter. As noted above, a setup time parameter can be established by a PLL type block 220 introducing a predetermined phase difference between an active edge of TSCLK (e.g., rising) versus an active edge of CLK (e.g., rising).

According to another aspect of the embodiments, the pull-up and pull-down devices (310-0 and 310-1) shown connected to I/O pad 302 (circled devices) can also be electrostatic discharge (ESD) protection devices. These devices can be configured to shunt current to either supply rail during an ESD event in order to spare other devices on a chip from damage.

Figure 4A:
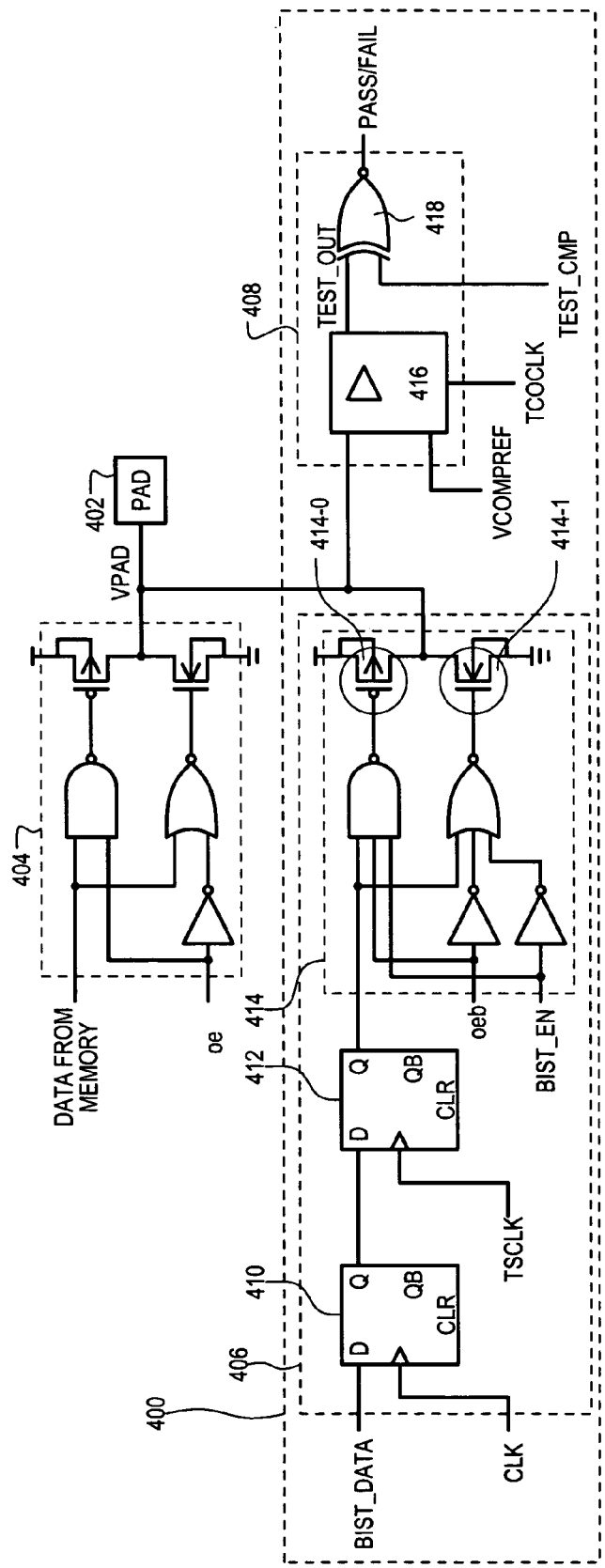
FIG. 4A is schematic diagram of a BIST input/output (I/O) control circuit that can be included in the second embodiment.

One example of a BIST I/O control circuit, such as those shown as 228 in FIG. 2, is set forth in FIG. 4A, and designated by the general reference character 400. A BIST I/O control circuit 400 can be connected to a physical I/O structure 402 (e.g., a bond pad). It is understood that such an I/O structure 402 may also be connected to a main chip I/O control circuit 230.

A main chip I/O control circuit 230 can include non-test I/O circuit that provide standard I/O functions for signals at I/O structure 402 during normal operation (e.g., output buffering, input buffering, data latching, etc.). FIG. 4A shows a non-test three state output driver 404 that may be included as part of a main chip I/O control circuit 230. It is understood that a non-test input circuit (not shown) could also be connected to I/O structure 402.

Non-test three state driver 404 can be enabled by an output enable signal "oe". When enabled, physical I/O structure 402 can be driven according to data "DATA FROM MEMORY" from a main chip portion (e.g., 204). It is understood that while three state driver 404 is referred to as "non-test", such a circuit portion can provide test output data in a test mode.

Referring still to FIG. 4A, a BIST I/O control circuit 400 can include a BIST data driving section 406 and a pass/fail detection circuit 408. A BIST data driving section 406 can receive test input data "BIST_DATA" generated within a BIST block 202. Such data can be applied to physical I/O structure 402 according to timing parameters established by clock signals generated by PLL type block 220.

The particular BIST data driving section 406 of FIG. 4A can have the same general structure as FIG. 3A, including a first D-latch 410, a second D-latch 412, and a three state driver 414. A first D-latch 410 can receive a BIST data value as a data input, a BIST data clock signal CLK as a clock input, and provide an output (Q) to second D-latch 412. Second D-latch 412 can receive an output of first D-latch 410 as an input, a setup test clock TSCLK as clock input, and provide an output (Q) to three state driver 414. In this way, the circuit of FIG. 3A can be incorporated into the BIST path that drives the bond pad through devices that are also used for ESD protection.

Like three state driver 310 of FIG. 3A, three state driver 414 can be enabled by a BIST enable signal "BIST_EN". In addition, three state driver 414 can also be enabled by inverse output enable signal "oeb". This can ensure that three state driver 414 is disabled when non-test three state driver 404 is enabled.

BIST data driving section 406 can also provide for testing of input setup time parameters for a chip 200 with respect to data I/Os. That is, like FIG. 3A, clock signal CLK and TSCLK can be generated to apply a BIST data value BIST_DATA according to a predetermined setup time by generating a TSCLK signal having a particular phase relationship to the clock signal "CLK" applied at the clock input of chip 200.

In this way, according to this embodiment, these devices can drive I/O structure 402 with data from a BIST block 202. This can essentially emulate an external tester directly driving an I/O structure 402 (e.g., bond pad).

According to another aspect of the embodiments, the pull-up and pull-down devices (414-0 and 414-1) of three state driver 414 can also be electrostatic discharge (ESD) control devices with respect to I/O pad 402. Thus, these devices can be configured to shunt current to either supply rail during an ESD event in order to spare other devices on a chip from damage.

A pass/fail detection circuit 408 can be coupled to I/O structure 402 and effectively compare an expected data or compare data value supplied by a BIST block 202 according to a test program and corresponding data provided from a main chip portion 204 undergoing testing.

The particular pass/fail detection circuit 408 of FIG. 4A can include a sense latch 416 and a compare circuit 418. A sense latch 416 can compare a voltage at physical I/O structure 402 to a reference voltage VCOMPREF to thereby establish an output logic value. Further, such a logic value can be latched according to a clock-to-output (TCO) clock signal.

Pass/fail detection circuit 408 can provide for testing of clock-to-output parameters for a chip 200. In particular, an output data value can be latched according to clock TCO. A PLL type block 220 can generate a TCO signal having a particular phase relationship to the clock signal "CLK" applied at the clock input of chip 200, and thus capture a data signal according to an established clock-to-output value.

A compare circuit 418 can compare captured output data TEST_OUT with compare data TEST_CMP from a BIST block 202 in order to determine if a test has resulted in a pass or fail condition. Such a pass or fail result can be provided as status data to a test block and I/F 218 (e.g., a PASS/FAIL indication).

Figure 4B:
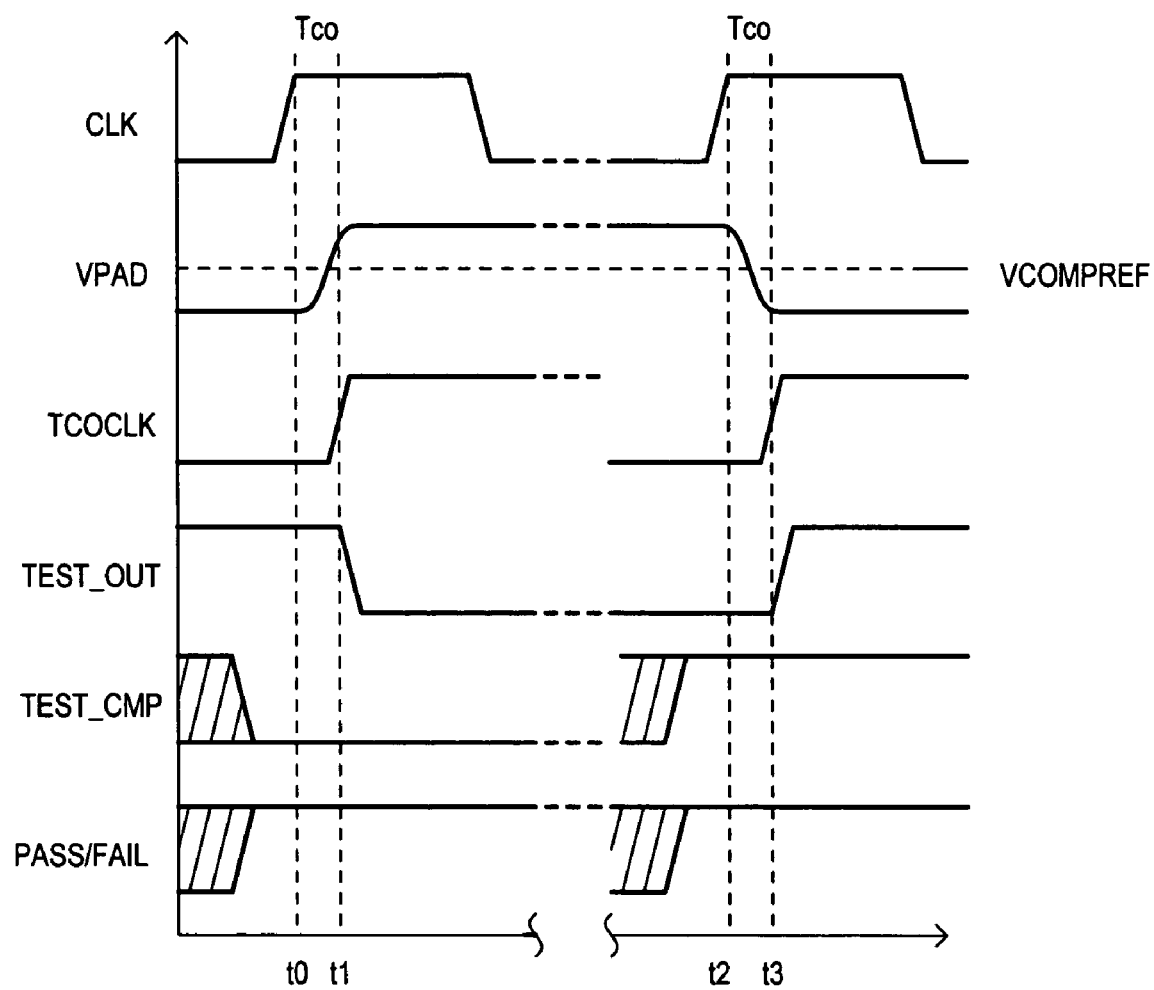
FIG. 4B is a timing diagram that shows a clock-to-output (Tco) emulation according to the circuit of FIG. 4A.

One very particular example of a clock-to-output test arrangement is illustrated in FIG. 4B. FIG. 4B is a timing diagram that includes a clock signal CLK, a voltage VPAD at I/O structure 402, a clock-to-output clock TCOCLK, an output test data value TEST_OUT, a compare data value TEST_CMP, and pass/fail indication PASS/FAIL.

As shown by FIG. 4B, following a transition in clock signal CLK (in this example, low-to-high) output data will be driven on an I/O structure 402 to generate potential VPAD. Such a potential is compared with a reference voltage VCOMPREF to generate an output logic value. This output logic value is latched according to clock-to-data-out clock TCOCLK. If resulting output data is valid (e.g., a TEST_OUT value matches a TEST_CMP value), a device may pass a given clock-to-output parameter. As noted above, a clock-to-output parameter can be established by a PLL type block 220 introducing a predetermined phase difference between an active edge of TCOCLK (e.g., rising) versus an active edge of CLK (e.g., rising).

According to the above embodiments of the invention, test patterns may be applied to I/O structures directly, thus emulating tester operations. However, no tester leads need to apply such signals to the bond pads. Further, such test patterns can be speed test patterns for establishing timing critical parameters and/or for classifying a device according to performance.

Still further, the embodiments of the present invention can enable chip bond options to be tested using common test vectors.

In this way, the present invention can provide a BIST interface and implementation capable of timing characterization essentially at the bond pad level. Such an arrangement may be particularly applicable to synchronous products, such as synchronous SRAMs.

It is understood that while the various aspects of the particular embodiment set forth herein has been described in detail, the present invention could be subject to various changes, substitutions, and alterations without departing from the spirit and scope of the invention.

What is claimed is:

1. An integrated circuit having a test capability, comprising:
   a main integrated circuit portion that provides functions according to input signals applied at physical inputs to the integrated circuit; and
   built-in self-test (BIST) portion that tests the main portion and includes BIST portion outputs coupled to the physical inputs for emulating predetermined signal timing at the physical inputs, and a buffer control circuit that drives at least one of the physical inputs according to BIST test input data and provides an electrostatic discharge protection path between at least one power supply node and the at least one of the physical inputs.

2. The integrated circuit of claim 1, wherein:
   the buffer control circuit includes a first transistor of a first conductivity type having a source-drain path coupled between the physical input and a first power supply node and a second transistor of a second conductivity type having a source-drain path coupled between the physical input and a second power supply node, the first and second transistors driving a corresponding physical input and each providing ESD protection paths to their respective power supply nodes.

3. The integrated circuit of claim 1, wherein:
   the BIST portion includes a signal pipeline structure for applying BIST test signals to the physical inputs that emulate a predetermined signal timing.

4. The integrated circuit of claim 3, wherein:
   the predetermined signal timing is an input signal setup time.

5. The integrated circuit of claim 4, wherein:
   the pipelined structure includes
      a first latch enabled according to a clock signal, and
      a second latch in series with the first latch that is enabled according to setup clock signal having a predetermined phase relationship with respect to the clock signal.

6. The integrated circuit of claim 3, further including:
   a phase lock loop (PLL) circuit that generates phase clock signals having different phase relationships; and
   the pipeline structure includes a plurality of stages arranged in series, and each stage outputs data according to a different one of the phase clock signals.

7. The integrated circuit of claim 1, wherein:
   the main integrated circuit portion generates test output data in a test mode; and
   the BIST portion includes a compare circuit that compares expected BIST data from the BIST portion with the test output data to generate a test pass/fail indication.

8. The integrated circuit of claim 1, wherein:
   the physical inputs comprise bond pads.

9. A method of testing an integrated circuit, comprising the steps of:
   testing performance features of the integrated circuit in a built-in self-test (BIST) operation by coupling BIST signals to physical inputs of the integrated circuit by applying BIST input signals according to at least two different clock signals to emulate a predetermined timing parameter; and
   the predetermined timing parameter is selected from the group consisting of
      a setup time that is the minimum time that an input value is stable prior to the activation of a corresponding clock signal, and
      a clock-to-output time that is the minimum time following the activation of a corresponding clock signal that an output signal is valid.

10. The method of testing of claim 9, further including:
    programming a BIST portion according to data applied to a serially configured test port; and
    reporting test results at the serially configured test port.

11. The method of testing of claim 9, wherein:
    coupling BIST signals to physical inputs of the integrated circuit includes applying BIST input signals generated by a BIST portion of the integrated circuit to bond pads of the integrated circuit.

12. An integrated circuit device, comprising:
    a main portion that includes a memory cell array coupled to at least one physical clock input and a plurality of physical signal inputs, the at least one physical clock input and physical signal inputs being formed on the surface of the integrated circuit device; and
    a built-in self-test (BIST) portion formed in the same substrate as the main portion, the BIST portion having BIST data outputs coupled to the physical signal inputs; and
    a phase lock loop type circuit that generates at least one internal clock signal and at least one test clock signal having the predetermined phase relationship with respect to the at least one internal clock signal.

13. The integrated circuit device of claim 12, further including:
    the phase lock loop type circuit generates at least one internal clock signal having a higher frequency than the external clock signal.

14. The integrated circuit device of claim 12, wherein:
    the predetermined phase relationship is selected from the group consisting of
      a setup time that is the a minimum time that an input value is stable prior to the activation of a corresponding clock signal, and
      a clock-to-output time that is the minimum time following the activation of a corresponding clock signal that an output signal is valid.

15. The integrated circuit device of claim 12, wherein:
    the BIST portion includes a buffer control circuit coupled to each physical signal input, each buffer control circuit including a pipeline structure that applies a BIST data value to the corresponding physical signal input according to predetermined phase relationship with respect to an external clock signal applied to the at least one physical clock input.

* * * * *